United States Patent
Zhu

(10) Patent No.: US 11,737,217 B2
(45) Date of Patent: Aug. 22, 2023

(54) DISPLAY DEVICE AND BACK PLATE THEREOF

(71) Applicant: WUHAN CHINA STAR OPTOELECTRONICS SEMICONDUCTOR DISPLAY TECHNOLOGY CO., LTD., Hubei (CN)

(72) Inventor: Zhitao Zhu, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 799 days.

(21) Appl. No.: 16/756,162

(22) PCT Filed: Mar. 24, 2020

(86) PCT No.: PCT/CN2020/080881
§ 371 (c)(1),
(2) Date: Apr. 15, 2020

(87) PCT Pub. No.: WO2021/174606
PCT Pub. Date: Sep. 10, 2021

(65) Prior Publication Data
US 2022/0312601 A1    Sep. 29, 2022

(30) Foreign Application Priority Data
Mar. 3, 2020 (CN) .......................... 202010138497.9

(51) Int. Cl.
G09F 9/30 (2006.01)
H05K 5/00 (2006.01)
(Continued)

(52) U.S. Cl.
CPC .......... *H05K 5/0017* (2013.01); *G09F 9/301* (2013.01); *H05K 5/03* (2013.01); *H10K 77/111* (2023.02)

(58) Field of Classification Search
CPC ............................... H10K 7/111; G09F 9/301
See application file for complete search history.

(56) References Cited

U.S. PATENT DOCUMENTS

2016/0357052 A1   12/2016   Kim et al.
2018/0122871 A1   5/2018   Choi
(Continued)

FOREIGN PATENT DOCUMENTS

CN   102496684 A        6/2012
CN   105789242 A   *   7/2016
(Continued)

*Primary Examiner* — Joseph L Williams
(74) *Attorney, Agent, or Firm* — Dickinson Wright PLLC

(57) ABSTRACT

The present invention provides a display device and a back plate thereof, including: a flexible layer having a first surface and a second surface opposite to each other; a framework layer disposed on the first surface, and including at least two framework strips which are spaced apart from each other, wherein the framework layer is made of a material including a polymer; and a filling layer covering a side of the framework layer away from the flexible layer, and embedded in a gap between adjacent ones of the framework strips.

18 Claims, 3 Drawing Sheets

(51) Int. Cl.
  *H05K 5/03* (2006.01)
  *H10K 77/10* (2023.01)

(56) References Cited

U.S. PATENT DOCUMENTS

| | | |
|---|---|---|
| 2018/0124937 A1 | 5/2018 | Choi |
| 2019/0191543 A1 | 6/2019 | Han |
| 2020/0388775 A1 | 12/2020 | Huang et al. |

FOREIGN PATENT DOCUMENTS

| | | |
|---|---|---|
| CN | 108023028 A | 5/2018 |
| CN | 108364571 A | 8/2018 |
| CN | 109860206 A | 6/2019 |
| CN | 110003803 A | 7/2019 |
| CN | 110035140 A | 7/2019 |
| CN | 110265438 A | 9/2019 |
| CN | 110288916 A | 9/2019 |
| CN | 110767086 A | 2/2020 |

\* cited by examiner

DISPLAY DEVICE AND BACK PLATE THEREOF

BACKGROUND OF INVENTION

Field of Invention

The present invention relates to a field of display technology, and in particular, to a display device and a back plate thereof.

Description of Prior Art

Existing display devices mainly include organic light emitting diode (OLED) display devices and liquid crystal display (LCD) devices. With the increase in demand for flexible and foldable smart phones, and the development of tablet computers and wearable electronic devices equipped with foldable displays, the development of flexible foldable display panels has been stimulated.

Currently, the OLED display device uses a back plate to support and protect a screen after peeling through a laser lift-off process. In the process of folding the screen, an inner surface of the back plate is deformed under pressure, and it will also exert a pressing force on adjacent layers, which will cause a ripple phenomenon.

Therefore, there is a need to propose a new technical solution to solve the above technical problems.

SUMMARY OF INVENTION

An embodiment of the present invention provides a display device and a back plate thereof to solve the problem that a ripple phenomenon occurs at the back plate in the display device.

An embodiment of the present invention provides a back plate, including:

a flexible layer having a first surface and a second surface opposite to each other;

a framework layer disposed on the first surface, and including at least two framework strips which are spaced apart from each other, wherein the framework layer is made of a material including a polymer; and a filling layer covering a side of the framework layer away from the flexible layer, and embedded in a gap between adjacent ones of the framework strips.

In the back plate according to an embodiment of the present invention, the framework strips are arranged at intervals along a first direction of the flexible layer and extend in a second direction of the flexible layer.

In the back plate according to an embodiment of the present invention, the framework strips are arranged at intervals along the second direction and extend in the first direction, and wherein a grid structure is formed by the framework strips arranged at intervals along the first direction and extending in a second direction and the framework strips arranged at intervals along the second direction and extending in the first direction.

In the back plate according to an embodiment of the present invention, an elastic modulus of the framework layer is greater than an elastic modulus of the filling layer.

In the back plate according to an embodiment of the present invention, an elastic modulus of the flexible layer is smaller than an elastic modulus of the framework layer.

In the back plate according to an embodiment of the present invention, the back plate includes a bending area and a non-bending area, which are disposed adjacent to each other, and a gap between adjacent ones of the framework strips in the bending area is larger than a gap between adjacent ones of the framework strips in the non-bending area.

In the back plate according to an embodiment of the present invention, the framework layer is formed on the first surface by screen printing.

In the back plate according to an embodiment of the present invention, the polymer includes polyimide, ethylene phthalate, and a cured glue.

In the back plate according to an embodiment of the present invention, the filling layer is made of a material including at least one of polyimide and ethylene phthalate Another embodiment of the present invention further provides a display device including a panel, a flip-chip thin film substrate, a flexible circuit board, a polarizer, an optical adhesive layer, a cover window, and a back plate, wherein the panel covers the back plate, an end of the panel is connected to the flexible circuit board through the flip-chip thin film substrate, the polarizer covers at least a part of the panel, the optical adhesive layer covers the polarizer, and the cover window covers the optical adhesive layer, wherein the back plate includes:

a flexible layer having a first surface and a second surface opposite to each other;

a framework layer disposed on the first surface, and including at least two framework strips which are spaced apart from each other, wherein the framework layer is made of a material including a polymer; and a filling layer covering a side of the framework layer away from the flexible layer, and embedded in a gap between adjacent ones of the framework strips.

In the display device according to an embodiment of the present invention, the framework strips are arranged at intervals along a first direction of the flexible layer and extend in a second direction of the flexible layer.

In the display device according to an embodiment of the present invention, the framework strips are arranged at intervals along the second direction and extend in the first direction, and wherein a grid structure is formed by the framework strips arranged at intervals along the first direction and extending in a second direction and the framework strips arranged at intervals along the second direction and extending in the first direction.

In the display device according to an embodiment of the present invention, an elastic modulus of the framework layer is greater than an elastic modulus of the filling layer.

In the display device according to an embodiment of the present invention, an elastic modulus of the flexible layer is smaller than an elastic modulus of the framework layer.

In the display device according to an embodiment of the present invention, the back plate includes a bending area and a non-bending area, which are disposed adjacent to each other, and a gap between adjacent ones of the framework strips in the bending area is larger than a gap between adjacent ones of the framework strips in the non-bending area.

In the display device according to an embodiment of the present invention, the framework layer is formed on the first surface by screen printing.

In the display device according to an embodiment of the present invention, the polymer includes polyimide, ethylene phthalate, and a cured glue.

In the display device according to an embodiment of the present invention, the filling layer is made of a material including at least one of polyimide and ethylene phthalate.

Compared with the prior art, in the display device and the back plate thereof provided by embodiments of the present invention, a framework layer is provided on a flexible layer to serve as a support structure of the display device. Further, a filling layer is provided on the framework layer and is embedded in a gap of the framework layer. Because an elastic modulus of the framework layer is greater than that of the filling layer, when the bending area is bent, the large elastic modulus of the framework layer is not conducive to bending, while the small elastic modulus of the filling layer is favorable for bending, so that during the bending process, the framework strips in the framework layer are squeezed by the filling layer, resulting in a direction favorable for bending, that is, the back plate provided by the present invention can be oriented to bend, thereby improving the ripple phenomenon caused by a squeezing force generated on the adjacent layers when the inner surface of the back plate is compressed and deformed during the bending process of the display device.

On the other hand, by designing a gap between the framework strips in the bending area to be larger than a gap between the framework strips in the non-bending area, that is, hardness of the non-bending area is greater than hardness of the bending area. On the one hand, the support strength of the non-bend area as a support layer is further increased, and on the other hand, it is beneficial to the bending of the bending area.

DETAILED DESCRIPTION OF PREFERRED EMBODIMENTS

Figure 1:
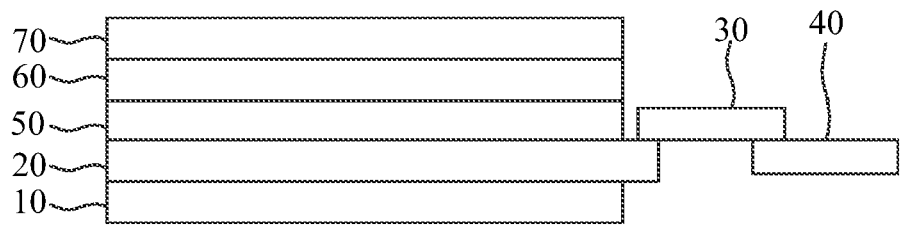
FIG. 1 is a schematic structural diagram of a display device according to an embodiment of the present invention.

In order to make the objectives, technical solutions, and advantages of the present invention clearer, the present invention will be described in further detail below with reference to the accompanying drawings. Referring to the drawings, wherein the same reference symbols represent the same elements. The following description is based on the specific embodiments of the present invention, which should not be construed as limiting other specific embodiments of the present invention that are not detailed herein. The term "embodiment" used in this specification means an example, instance, or illustration.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of this application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

An embodiment of the present invention provides a display device. As shown in FIG. 1, the display device includes a panel 20, a flip-chip thin film substrate 30, a flexible circuit board 40, a polarizer 50, an optical adhesive layer 60, a cover window 70, and a back plate 10, wherein the panel 20 covers the back plate 10, an end of the panel 20 is connected to the flexible circuit board 40 through the flip-chip thin film substrate 30, the polarizer 50 covers at least a part of the panel 10, the optical adhesive layer 60 covers the polarizer 50, and the cover window 70 covers the optical adhesive layer 60.

Figure 2:
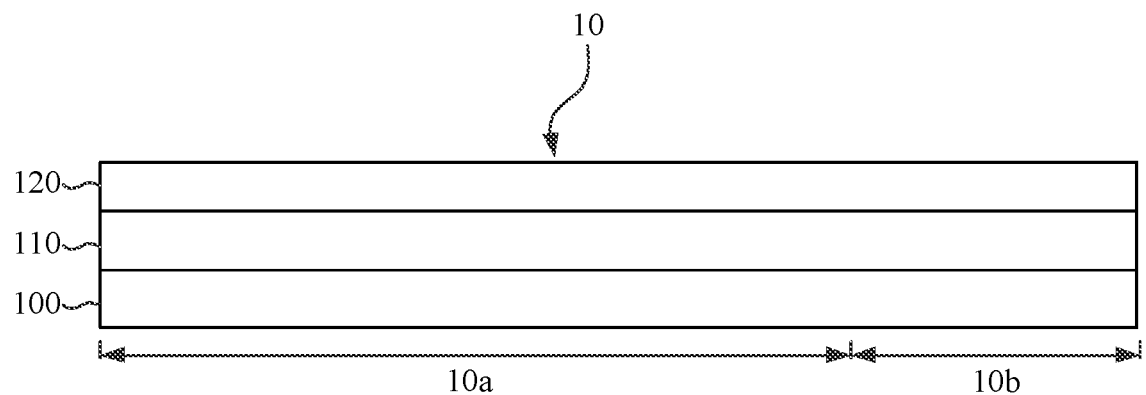
FIG. 2 is a schematic diagram of a back plate according to an embodiment of the present invention.
Figure 3:
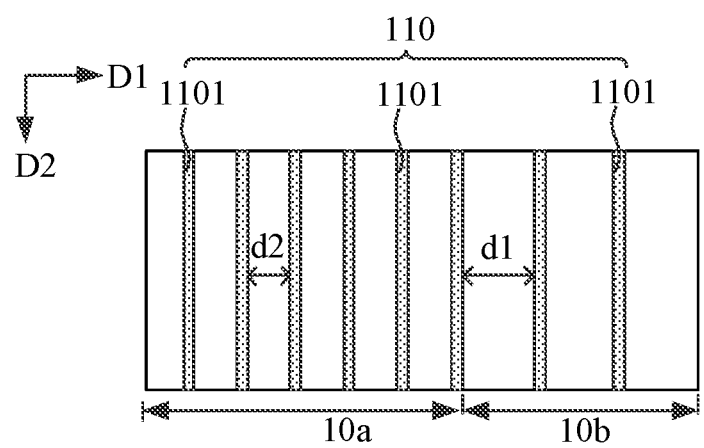
FIG. 3 is a top view of a framework layer in a back plate according to an embodiment of the present invention.

As shown in FIG. 2 and FIG. 3, an embodiment of the present invention further provides a back plate. The back plate 10 includes a flexible layer 100 having a first surface and a second surface opposite to each other. The flexible layer 100 is made of a flexible material including polyimide (PI), polyethylene terephthalate (PET), bismaleimide-modified triazine resin material, and other flexible materials.

A framework layer 110 is disposed on the first surface. The framework layer 110 includes at least two framework strips 1101, and the framework strips 1101 are arranged at intervals. A width of each of the framework strips ranges from 0.5 micrometer to 5 micrometers. Material of the framework strip includes a polymer material. Specifically, the polymer includes a polydimethylsiloxane-based polymer, a polyurethane-based polymer, a polyamide-based polymer, a polyester-based polymer, other flexible materials, and a curing glue. The preferred polymer materials include polyimide, polyethylene terephthalate, and a curing glue.

The filling layer 120 covers a side of the framework layer 110 away from the flexible layer 100, and the filling layer 120 is embedded in a gap between adjacent ones of the framework strips 110. The material of the filling layer 120 includes polydimethylsiloxane-based polymer, polyurethane-based polymer, polyamide-based polymer, polyester-based polymer, and other flexible materials. Preferably, the polymer material includes polyimide, and polyethylene terephthalate.

Further, still referring to FIG. 2 and FIG. 3, the framework strips 1101 are arranged at intervals along the first direction D1 of the flexible layer 100 and extend in the second direction D2 of the flexible layer 100. The elastic modulus P1 of the flexible layer 100 is smaller than the elastic modulus P2 of the framework layer 110.

Specifically, the back plate 10 includes a bending area 10b and a non-bending area 10a, the bending area 10b and the non-bending area 10a are disposed adjacent to each other, and a gap d1 between adjacent ones of the framework strips 1101 in the bending area 10b is larger than a gap d2 between adjacent ones of the framework strips 1101 in the non-bending area 10a. At this time, the elastic modulus of the bending area 10b is smaller than that of the non-bending area 10a, that is, the hardness of the bending area 10b is less than the hardness of the non-bending area 10a, which is beneficial to increasing a support strength of the non-bending 10a as a support layer, as well as beneficial to oriented bending of the bending area 10b.

Figure 5:
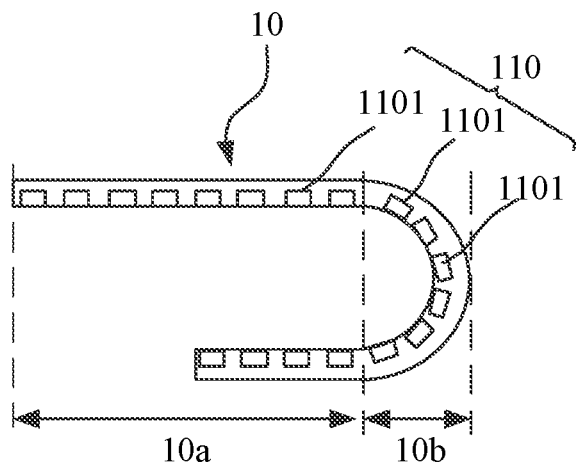
FIG. 5 is a schematic structural diagram of a back plate according to an embodiment of the present invention.

Further, the elastic modulus P2 of the framework layer 110 is greater than the elastic modulus P2 of the filling layer 120. Specifically, the larger the elastic modulus, the greater the rigidity, such that when the back plate 10 is used as a support layer, it is beneficial to increasing the support strength. Referring to FIG. 5, in an embodiment of the present invention, the framework layer 110 is used as the intermediate layer of the back plate 10. Since the elastic modulus P2 of the framework layer 110 is greater than the elastic modulus P3 of the filling layer 120, when the back plate 10 is bent, the framework layer 100 is not conducive to bending. In addition, since the filling layer 120 is more flexible, when it is squeezed, a direction favorable for bending is generated, that is, the back plate provided by the present invention can be oriented to bend, thereby improving the ripple phenomenon caused by a squeezing force generated on the adjacent layers when the inner surface of the back plate is compressed and deformed during the bending process of the display device.

Figure 6:
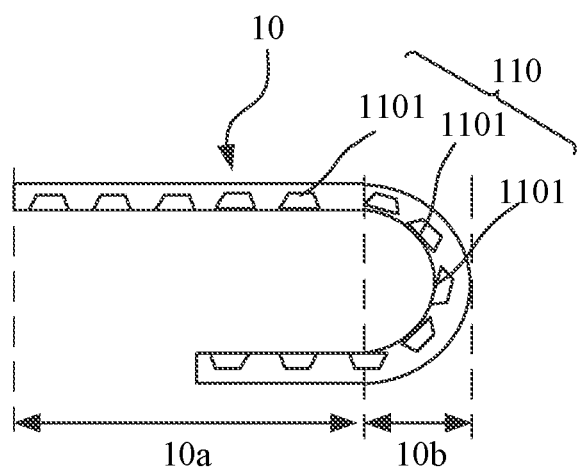
FIG. 6 is schematic structural diagram of a back plate according to another embodiment of the present invention.

Further, in an embodiment of the present invention, a shape of each of the framework strips 1101 includes a square and a trapezoid (in a cross-sectional view). For example, as shown in FIG. 6, when the shape of each of the framework strips 1101 is trapezoidal, the framework strips 1101 is squeezed by the relatively flexible filling layer 120 during the bending process of the back plate 10. Since opposite sides of the trapezoid have slopes, a direction that is favorable for bending is generated in the framework layer 1101 during the squeezing process, thereby achieving oriented bending of the display device. It should be noted that, in an embodiment of the present invention, the shape of the framework strip 1101 is not particularly limited to a square or a trapezoid, but also includes other shapes, such as a circle, an oval, and the like.

It should be noted that, in an embodiment of the present invention, magnitude of the elastic modulus P1 of the flexible layer 100 and magnitude of the elastic modulus P3 of the filling layer 120 are not particularly limited, including P1>P3, P1<P3, or P1=P3.

Figure 4:
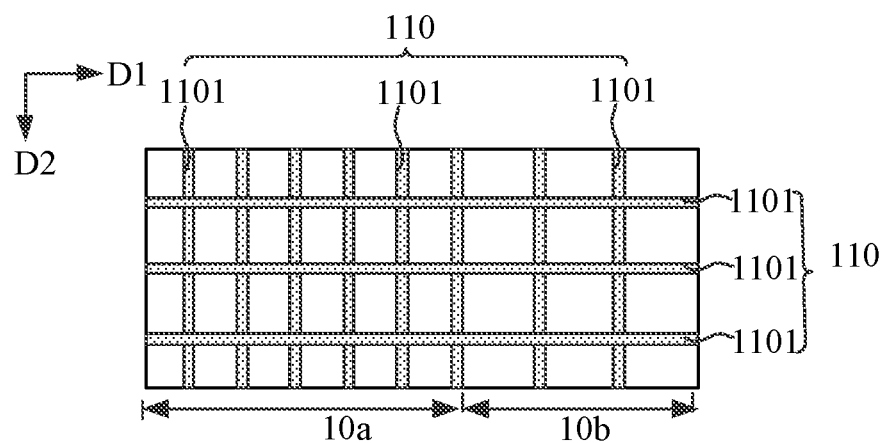
FIG. 4 is another plan view of a framework layer in a back plate according to an embodiment of the present invention.

Optionally, as shown in FIG. 4, in an embodiment of the present invention, the framework strips 1101 are arranged at intervals along the second direction D2 and extend in the first direction D1, wherein, a grid structure is formed by the framework strips 1101 arranged at intervals along the first direction D1 and extending in the second direction D2 and the framework strips 1101 arranged at intervals along the second direction D2 and extending in the first direction D1. As shown in the FIG. 4, the grid structure of the bending area 10b is larger than the grid structure of the non-bending area 10a. At this time, the elastic modulus of the bending area 10b is smaller than that of the non-bending area 10a, which is beneficial to increasing a support strength of the non-bending 10a as a support layer, and is beneficial to the bending of the bending area 10.

Further, the framework layer 110 is formed on the first surface by screen printing. The framework layer 110 may also be formed on the first side of the flexible layer 100 by other methods. For example, a framework material layer is formed on the flexible layer 100 by chemical vapor deposition or plasma enhanced physical vapor deposition, then formed into the framework layer 110 by a method such as grinding and etching.

It should be noted that, in an embodiment of the present invention, an included angle formed by the first direction D1 and the second direction D2 ranges from 0 degrees to 180 degrees, that is, an included angle between the framework strips 1101 arranged at intervals along the first direction D1 and extending in the second direction D2 and the framework strips 1101 arranged at intervals along the second direction D2 and extending in the first direction D1 ranges from 0 degrees to 180 degrees. The structures shown in the drawings are only examples, and the present invention also includes other examples. For instance, when the included angle between the framework strips 1101 arranged at intervals along the first direction D1 and extending in the second direction D2 and the framework strips 1101 arranged at intervals along the second direction D2 and extending in the first direction D1 is 60 degrees, the formed grid structure has a parallelogram structure.

Compared with the prior art, in the display device and the back plate thereof provided by embodiments of the present invention, a framework layer is provided on a flexible layer to serve as a support structure of the display device. Further, a filling layer is provided on the framework layer and is embedded in a gap of the framework layer. Because an elastic modulus of the framework layer is greater than that of the filling layer, when the bending area is bent, the large elastic modulus of the framework layer is not conducive to bending, while the small elastic modulus of the filling layer is favorable for bending, so that during the bending process, the framework strips in the framework layer are squeezed by the filling layer, resulting in a direction favorable for bending, that is, the back plate provided by the present invention can be oriented to bend, thereby improving the ripple phenomenon caused by a squeezing force generated on the adjacent layers when the inner surface of the back plate is compressed and deformed during the bending process of the display device.

On the other hand, by designing a gap between the framework strips in the bending area to be larger than a gap between the framework strips in the non-bending area, that is, hardness of the non-bending area is greater than hardness of the bending area. On the one hand, the support strength of the non-bend area as a support layer is further increased, and on the other hand, it is beneficial to the bending of the bending area.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:
1. A back plate, comprising:
a flexible layer having a first surface and a second surface opposite to each other;
a framework layer disposed on the first surface, and comprising at least two framework strips which are spaced apart from each other, wherein the framework layer is made of a material comprising a polymer; and a filling layer covering a side of the framework layer away from the flexible layer, and embedded in a gap between adjacent ones of the framework strips.

2. The back plate according to claim 1, wherein the framework strips are arranged at intervals along a first direction of the flexible layer and extend in a second direction of the flexible layer.

3. The back plate according to claim 2, wherein the framework strips are arranged at intervals along the second direction and extend in the first direction, and wherein a grid structure is formed by the framework strips arranged at intervals along the first direction and extending in a second direction and the framework strips arranged at intervals along the second direction and extending in the first direction.

4. The back sheet according to claim 1, wherein an elastic modulus of the framework layer is greater than an elastic modulus of the filling layer.

5. The back sheet according to claim 1, wherein an elastic modulus of the flexible layer is smaller than an elastic modulus of the framework layer.

6. The back plate according to claim 1, wherein the back plate comprises a bending area and a non-bending area, which are disposed adjacent to each other, and a gap between adjacent ones of the framework strips in the bending area is larger than a gap between adjacent ones of the framework strips in the non-bending area.

7. The back sheet according to claim 6, wherein the framework layer is formed on the first surface by screen printing.

8. The back sheet according to claim 7, wherein the polymer comprises polyimide, ethylene phthalate, and a cured glue.

9. The back sheet according to claim 1, wherein the filling layer is made of a material comprising at least one of polyimide and ethylene phthalate.

10. A display device, comprising a panel, a flip-chip thin film substrate, a flexible circuit board, a polarizer, an optical adhesive layer, a cover window, and a back plate, wherein the panel covers the back plate, an end of the panel is connected to the flexible circuit board through the flip-chip thin film substrate, the polarizer covers at least a part of the panel, the optical adhesive layer covers the polarizer, and the cover window covers the optical adhesive layer, wherein the back plate comprises:

a flexible layer having a first surface and a second surface opposite to each other;
a framework layer disposed on the first surface, and comprising at least two framework strips which are spaced apart from each other, wherein the framework layer is made of a material comprising a polymer; and
a filling layer covering a side of the framework layer away from the flexible layer, and embedded in a gap between adjacent ones of the framework strips.

11. The display device according to claim 10, wherein the framework strips are arranged at intervals along a first direction of the flexible layer and extend in a second direction of the flexible layer.

12. The display device according to claim 11, wherein the framework strips are arranged at intervals along the second direction and extend in the first direction, and wherein a grid structure is formed by the framework strips arranged at intervals along the first direction and extending in a second direction and the framework strips arranged at intervals along the second direction and extending in the first direction.

13. The display device according to claim 10, wherein an elastic modulus of the framework layer is greater than an elastic modulus of the filling layer.

14. The display device according to claim 10, an elastic modulus of the flexible layer is smaller than an elastic modulus of the framework layer.

15. The display device according to claim 10, wherein the back plate comprises a bending area and a non-bending area, which are disposed adjacent to each other, and a gap between adjacent ones of the framework strips in the bending area is larger than a gap between adjacent ones of the framework strips in the non-bending area.

16. The display device according to claim 15, wherein the framework layer is formed on the first surface by screen printing.

17. The display device according to claim 16, wherein the polymer comprises polyimide, ethylene phthalate, and a cured glue.

18. The display device according to claim 17, wherein the filling layer is made of a material comprising at least one of polyimide and ethylene phthalate.

* * * * *